United States Patent
Kim et al.

(10) Patent No.: US 11,552,264 B2
(45) Date of Patent: Jan. 10, 2023

(54) ELECTRONIC APPARATUS

(71) Applicant: Samsung Display Co., Ltd., Yongin-si (KR)

(72) Inventors: Yunjae Kim, Cheonan-si (KR); Dasom Gu, Asan-si (KR); Jaiku Shin, Hwaseong-si (KR); Yongchan Jeon, Cheonan-si (KR); Sung-Ki Jung, Asan-si (KR); Hyun-Been Hwang, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/461,005

(22) Filed: Aug. 30, 2021

(65) Prior Publication Data

US 2022/0199921 A1 Jun. 23, 2022

(30) Foreign Application Priority Data

Dec. 18, 2020 (KR) .................. 10-2020-0178991

(51) Int. Cl.
*G06F 1/16* (2006.01)
*H04M 1/02* (2006.01)
(Continued)

(52) U.S. Cl.
CPC ........ *H01L 51/0097* (2013.01); *G06F 1/1641* (2013.01); *G06F 1/1652* (2013.01);
(Continued)

(58) Field of Classification Search
CPC ........ G06F 1/1652; G06F 1/16; G06F 1/1641; G06F 1/1618; G06F 1/1637; G06F 2203/04102; G06F 3/046; G06F 1/1626; G06F 1/1681; G06F 1/1675; G06F 3/0412; G06F 3/041; G06F 3/0488;
(Continued)

(56) References Cited

U.S. PATENT DOCUMENTS 9,348,450 B1 * 5/2016 Kim ...................... G06F 1/1616
10,777,101 B2 * 9/2020 Park .................... H01L 51/5036
(Continued)

FOREIGN PATENT DOCUMENTS

KR   10-2020-0084495   7/2020
KR   10-2022-0006669   1/2022

*Primary Examiner* — Dismery Mercedes
(74) *Attorney, Agent, or Firm* — Kile Park Reed & Houtteman PLLC

(57) ABSTRACT

An electronic apparatus includes an electronic panel, a first support plate below the electronic panel, a second support plate below the first support plate, and a first input sensor between the first support plate and the second support plate. The electronic panel includes light emitting parts arranged in an active area. The active area includes a folding area and a first non-folding area and a second non-folding area adjacent to the folding area and spaced apart from each other. The first support plate includes a folding part overlapping the folding area, and a first support part and a second support part spaced apart from each other, the folding part being disposed between the first support part and the second support part. An edge of the second support plate protrudes further in the second direction than an edge of the first support plate protrudes.

20 Claims, 14 Drawing Sheets

(51) Int. Cl.
  *H01L 51/00* (2006.01)
  *H01L 27/32* (2006.01)
  *G06F 3/046* (2006.01)
  *G06F 3/041* (2006.01)
  *G06F 3/045* (2006.01)
  *G06F 3/044* (2006.01)

(52) U.S. Cl.
  CPC ............ *G06F 3/046* (2013.01); *H01L 27/323* (2013.01); *H04M 1/0268* (2013.01); *G06F 3/044* (2013.01); *G06F 3/045* (2013.01); *G06F 3/0412* (2013.01); *G06F 2203/04102* (2013.01); *G06F 2203/04106* (2013.01); *H01L 2251/5338* (2013.01); *H04M 1/0216* (2013.01)

(58) Field of Classification Search
  CPC ...... G06F 3/03547; G06F 2203/04101–04105; H01L 51/0097; H01L 2251/5338; H01L 27/323; H01L 27/3244; H04M 1/0268; H04M 1/0216; H04M 1/0266; H04M 1/0214
  See application file for complete search history.

(56) References Cited

U.S. PATENT DOCUMENTS

| | | | |
|---|---|---|---|
| 11,096,293 B2* | 8/2021 | Park | G02F 1/133305 |
| 2012/0236484 A1* | 9/2012 | Miyake | G06F 1/1641 |
| | | | 361/679.01 |
| 2013/0037228 A1* | 2/2013 | Verschoor | G06F 1/1652 |
| | | | 160/377 |
| 2015/0177789 A1* | 6/2015 | Jinbo | H01L 27/323 |
| | | | 313/511 |
| 2017/0242506 A1* | 8/2017 | Patel | G06F 3/041 |
| 2018/0062090 A1* | 3/2018 | Kim | H01L 51/5253 |
| 2019/0036068 A1* | 1/2019 | Kim | G06F 1/1652 |
| 2020/0209998 A1 | 7/2020 | Shin et al. | |
| 2021/0410306 A1* | 12/2021 | Xia | G06F 1/1652 |
| 2022/0011819 A1 | 1/2022 | Shin et al. | |

* cited by examiner

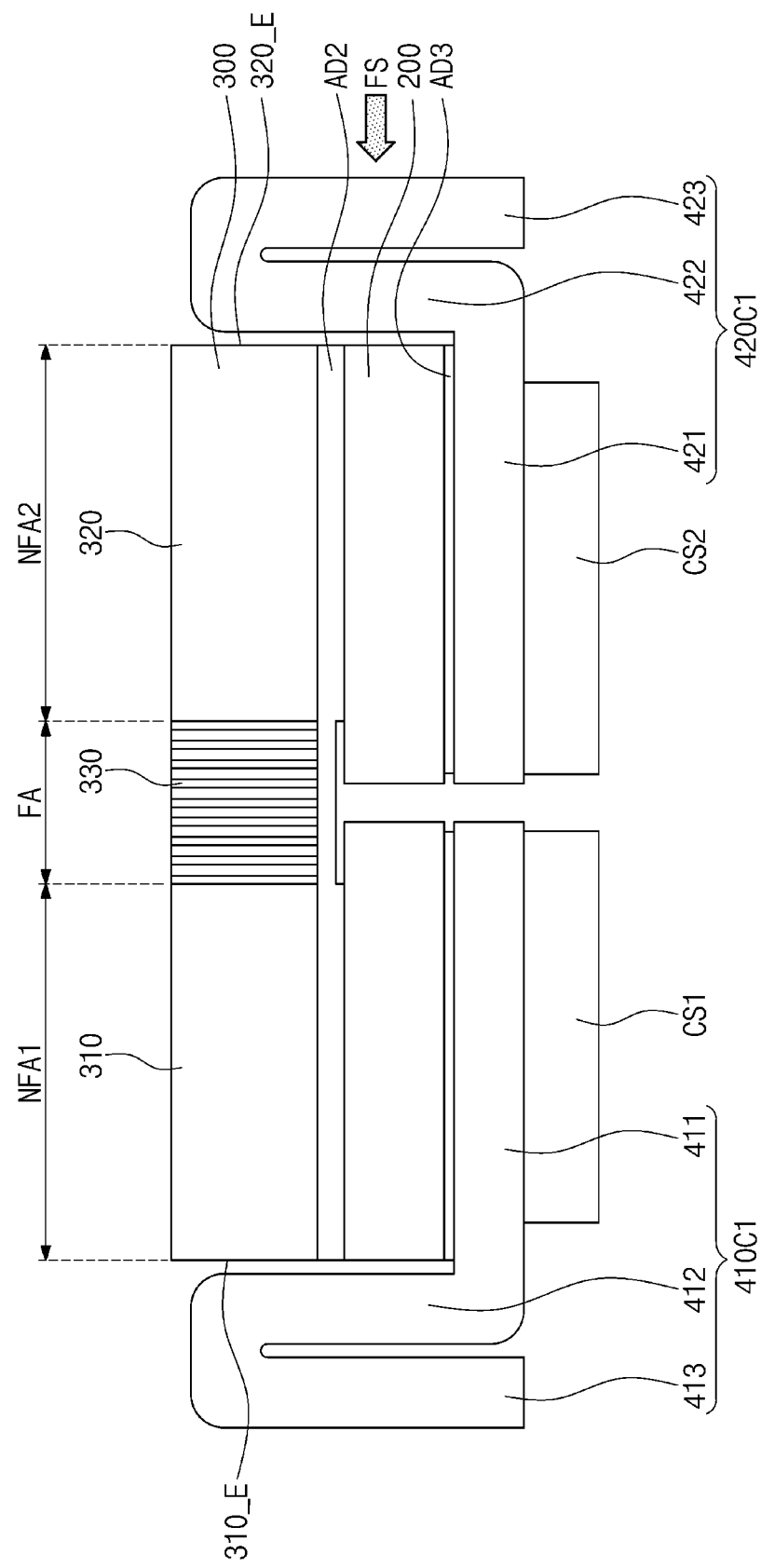

ELECTRONIC APPARATUS

CROSS-REFERENCE TO RELATED APPLICATION(S)

This application claims priority to and benefits of Korean Patent Application No. 10-2020-0178991 under 35 U.S.C. § 119, filed on Dec. 18, 2020 in the Korean Intellectual Property Office, the entire contents of which are incorporated herein by reference.

BACKGROUND

The disclosure relates to a foldable electronic apparatus.

Electronic apparatuses include active areas which are activated in response to electrical signals. Such an electronic apparatus may sense an input applied from the outside through the active area and, at the same time, display various images to provide information to a user. Recently, display devices of the electronic apparatus having various shapes have been developed, and active areas having various shapes have been embodied.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides an electronic apparatus which is foldable and capable of sensing an external input. According to the disclosure, reliability of the electronic apparatus may be improved against an external impact.

In an embodiment, an electronic apparatus may include an electronic panel including light emitting parts, and an active area in which the light emitting parts are arranged wherein the active area may include a folding area that is foldable with respect to a folding axis extending in a first direction, and first non-folding area and a second non-folding areas that are adjacent to the folding area and spaced apart from each other in a second direction intersecting the first direction, a first support plate which is disposed below the electronic panel and includes a folding part overlapping the folding area of the active area and a first support part and a second support part spaced apart from each other in the second direction wherein the folding part may be disposed between the first support part and the second support part, a second support plate disposed below the first support plate, and a first input sensor disposed between the first support plate and the second support plate, the first input senor sensing a first external input. An edge of the second support plate may protrude further in the second direction than an edge of the first support plate protrudes.

In an embodiment, a gap between the edge of the second support plate and the edge of the first support plate may be in a range of about 100 µm to about 500 µm.

In an embodiment, each of the first support part and the second support part may each include glass or plastic.

In an embodiment, the folding part may include metal.

In an embodiment, the folding part may include a plurality of through-portions, which pass through the folding part in a plan view.

In an embodiment, the folding part may have a lattice shape in a plan view.

In an embodiment, the folding part may have a shape of stripes arranged in the second direction in a plan view.

In an embodiment, the electronic panel may further include a second input sensor which overlaps the active area and senses a second external input. The second external input may be different from the first external input.

In an embodiment, the first external input may include a pen input. The second external input may include a touch input by a user.

In an embodiment, the second support plate may include a first plate and a second plate which have side surfaces facing each other and spaced apart from each other in the second direction. The folding area of the active area may be disposed between the first plate and the second plate. The edge of the second support plate may be located in each of the first plate and the second plate.

In an embodiment, the second support plate may include a flat portion that overlaps the electronic panel and a bending portion that extends and bends from the flat portion and does not overlap the electronic panel in a plan view. The bending portion may overlap the edge of the first support plate in a view of the second direction.

In an embodiment, the second support plate may further include an additional bending portion that extends and bends from the first bending portion. The bending portion and the additional bending portion may overlap the edge of the first support plate in a view of the second direction.

In an embodiment, the second support plate may include a copper alloy or stainless steel.

In an embodiment, an electronic apparatus may include an electronic panel including a folding area that is foldable with respect to a folding axis extending in a first direction, and a first non-folding area and a second non-folding area that are adjacent to the folding area and spaced apart from each other in a second direction intersecting the first direction, a first support plate disposed below the electronic panel, the first support plate comprising a folding part overlapping the folding area and a first support part and a second support part spaced apart from each other in the second direction, the folding part being disposed between the first support part and the second support part, a second support plate disposed below the first support plate, and an input sensor disposed between the first support plate and the second support plate, the input sensor sensing an external input. The second support plate includes an edge further protruding than an edge of the first support plate in a plan view.

In an embodiment, the first support part and the second support part may be electrically insulated.

In an embodiment, a gap between the edge of the second support plate and the edge of the first support plate may be in a range of about 100 µm to about 500 µm.

In an embodiment, the second support plate may include a flat portion that overlaps the first support part and a bending portion that extends and bends from the flat portion. The bending portion may overlap the edge of the first support plate in a view of the second direction.

In an embodiment, the second support plate may further include an additional bending portion that extends and bends from the bending portion. The bending portion and the additional bending portion may overlap the edge of the first support plate in a view of the second direction.

In an embodiment, the second support plate may include a copper alloy or stainless steel.

In an embodiment, the folding part may include a material different from a material of the first support part and a material of the second support part.

BRIEF DESCRIPTION OF THE DRAWINGS

The above and other aspects and features of the disclosure will become more apparent by describing in detail embodiments thereof with reference to the attached drawings, in which:

FIGS. 6A to 6C are schematic cross-sectional views of electronic apparatuses according to embodiments.

DETAILED DESCRIPTION OF THE EMBODIMENTS

Figure 1A:
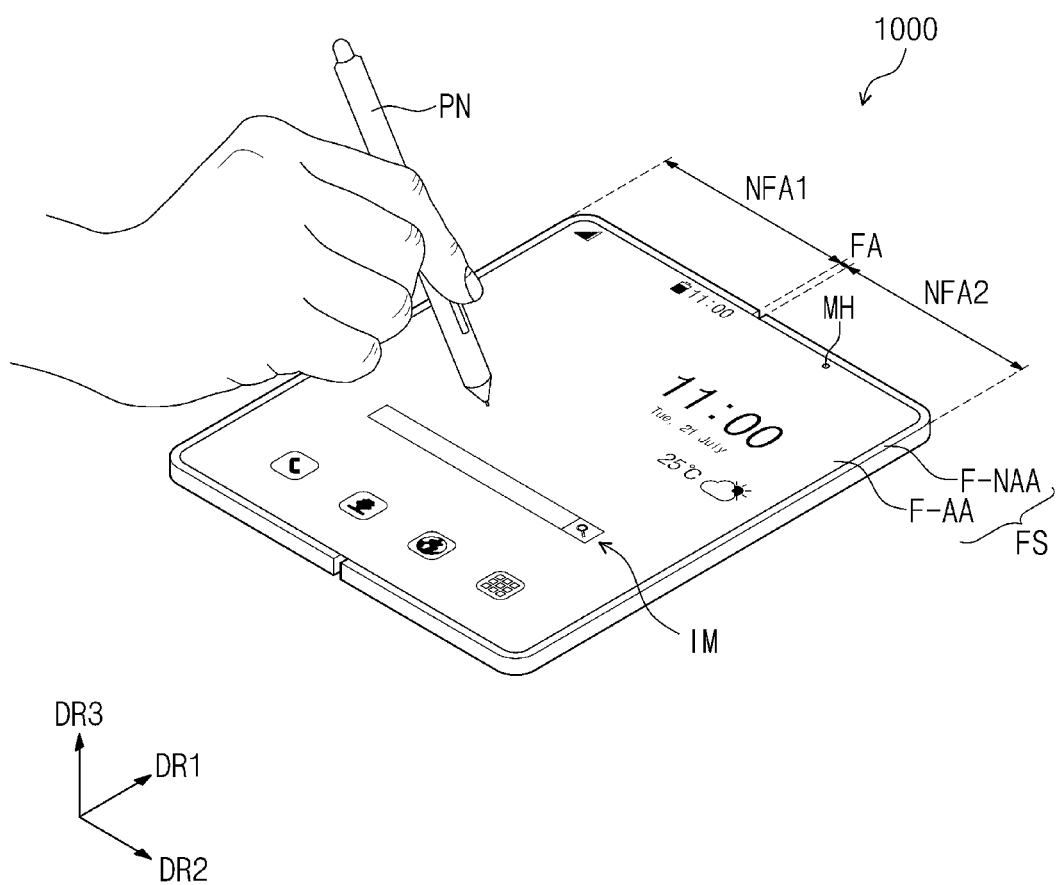
FIGS. 1A to 1E are schematic perspective views of an electronic apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will be understood that when an element (or a region, a layer, a portion, or the like) is referred to as "being on", "connected to" or "coupled to" another element, it can be directly disposed on, connected, or coupled to the other element, or intervening elements may be disposed therebetween.

Like numbers refer to like elements throughout. Also, in the drawings, the thicknesses, ratios, and dimensions of the elements are exaggerated for effective description of the technical contents.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Although the terms first, second, etc. may be used herein to describe various elements, these elements should not be limited by these terms. These terms are only used to distinguish one element from another element. For example, a first element may be referred to as a second element, and similarly, a second element may be referred to as a first element without departing from the scope of the disclosure. The singular forms include the plural forms as well unless the context clearly indicates otherwise.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

"About" or "approximately" as used herein is inclusive of the stated value and means within an acceptable range of deviation for the value as determined by one of ordinary skill in the art, considering the measurement in question and the error associated with measurement of the quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that the term "includes" or "comprises", when used in this specification, specifies the presence of stated features, integers, steps, operations, elements, components, or a combination thereof, but does not preclude the presence or addition of one or more other features, integers, steps, operations, elements, components, or combinations thereof.

Hereinafter, embodiments will be described with reference to the accompanying drawings.

Figure 1B:
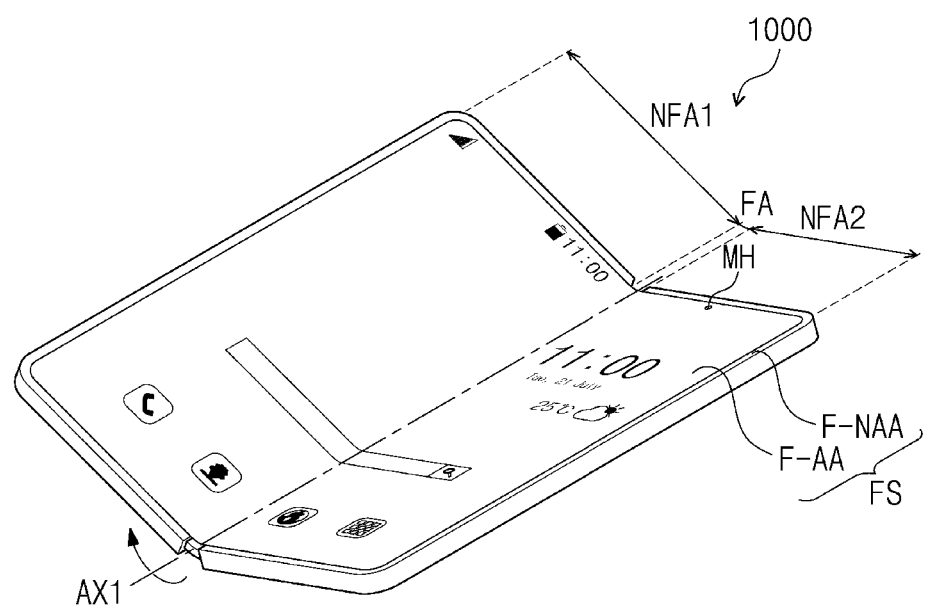
Figure 1C:
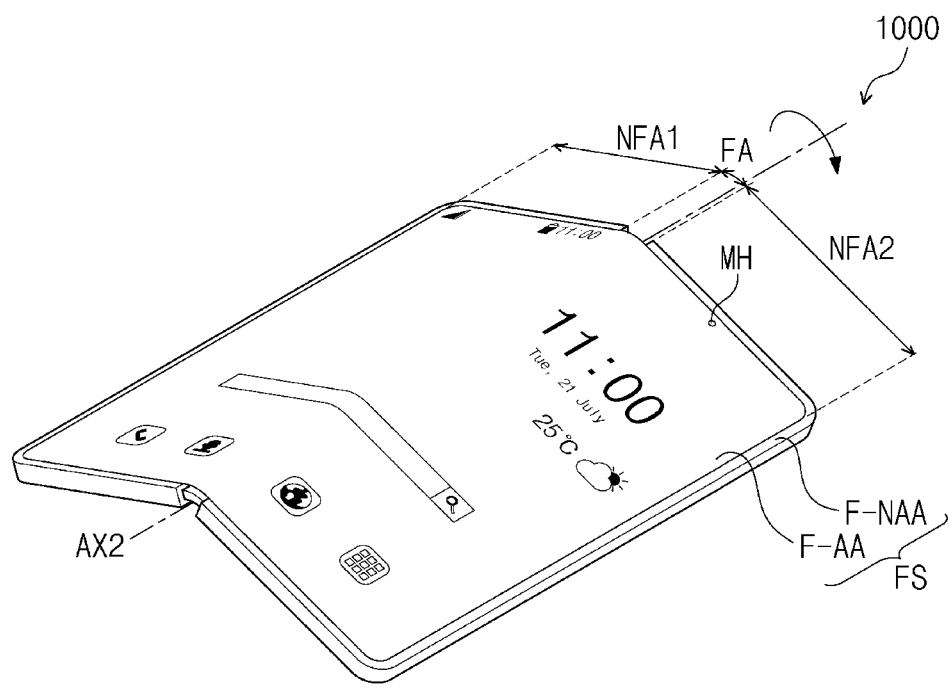
Figure 1C:
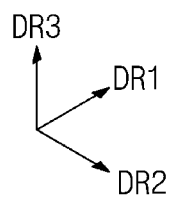
Figure 1D:
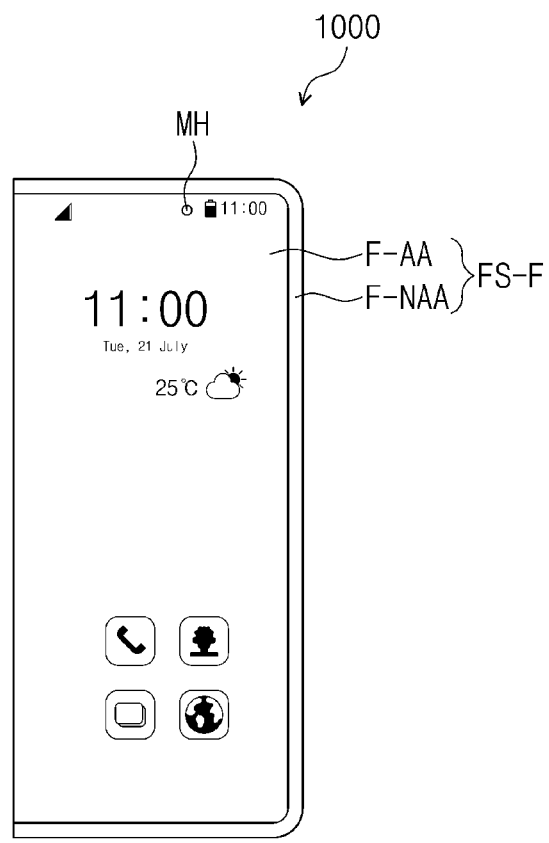
Figure 1E:
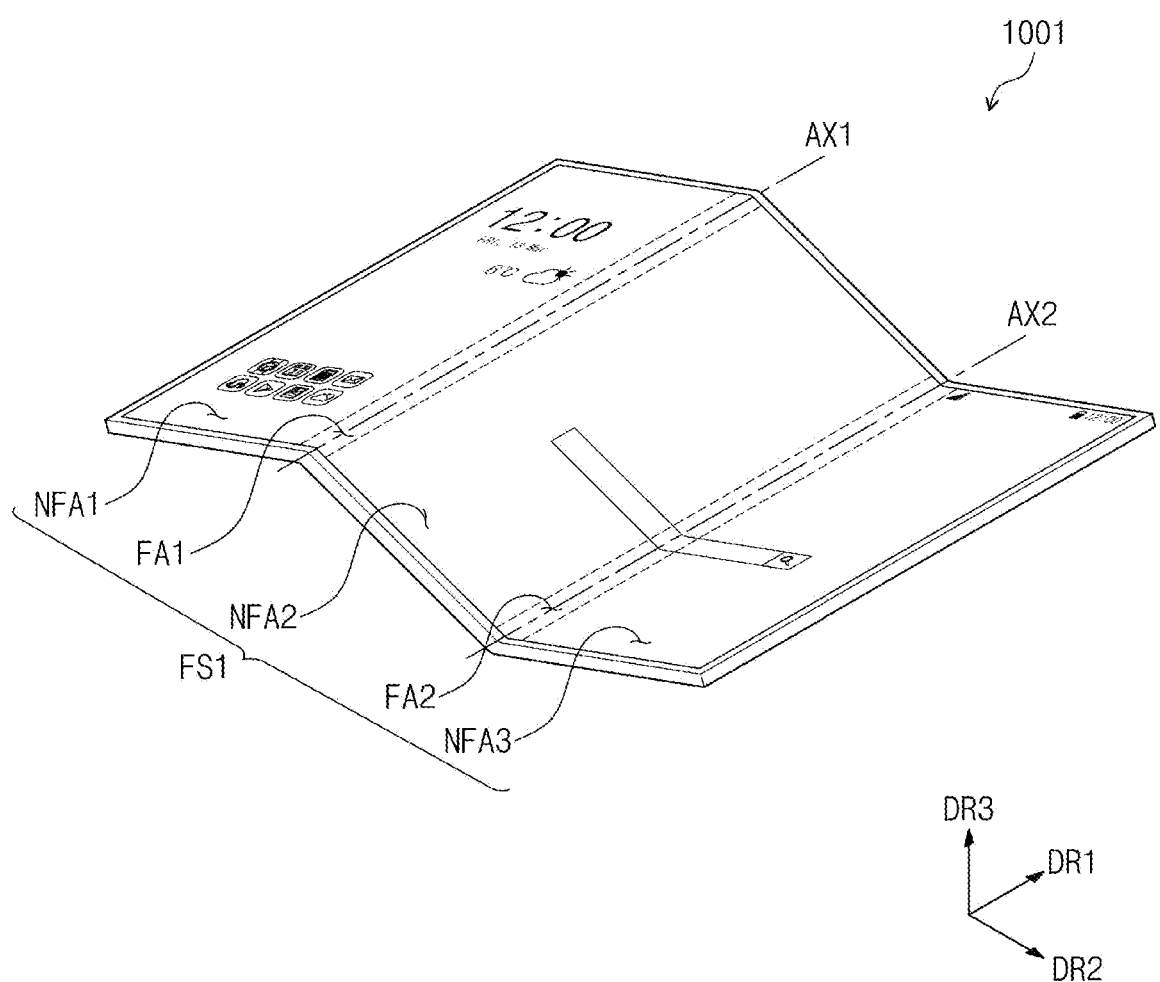

FIGS. 1A to 1E are schematic perspective views of an electronic apparatus according to an embodiment. FIG. 1A is a schematic perspective view illustrating a state in which an electronic apparatus 1000 is unfolded, and FIGS. 1B to 1D are schematic perspective views illustrating a state in which the electronic apparatus 1000 is folded. FIG. 1E is a schematic perspective view illustrating a state in which an electronic apparatus 1001 is folded. Hereinafter, an embodiment will be described with reference to FIGS. 1A and 1E.

The electronic apparatuses 1000 and 1001 may be a device activated in response to an electrical signal. The electronic apparatuses 1000 and 1001 may include various embodiments. For example, the electronic apparatuses 1000 and 1001 may include a tablet, a laptop, a computer, a smart television, or the like. In the embodiment, the electronic apparatuses 1000 and 1001 are illustrated as a smart phone.

The electronic apparatuses 1000 and 1001 may display an image IM, in a third direction DR3, onto a display surface FS parallel to each of a first direction DR1 and a second direction DR2. The first display surface FS on which the image IM is displayed may correspond to front surfaces of the display apparatuses 1000 and 1001. The image IM may include static images as well as dynamic images. In FIGS. 1A to 1E, an internal search box and a watch are illustrated as examples of the image IM.

In the embodiment, a front surface (or a top surface) and a rear surface (or a bottom surface) for each member are defined, in an unfolded state, with respect to the direction in which the image IM is displayed. The front and rear surfaces are opposed to each other in the third direction DR3, and the normal direction of each of the front and rear surfaces may be parallel to the third direction DR3.

The distance between the front surface and the rear surface in the third direction DR3 may correspond to the thickness/height of the electronic apparatus 1000 in the third direction DR3. Here, directions indicated as the first to third directions DR1, DR2, and DR3 may have a relative concept and thus may be changed to other directions.

The display apparatuses 1000 and 1001 may sense an external input applied from the outside. The external input may be an input of a user. The input of the user may include various types of inputs such as a part of the user's body, an electromagnetic pen PN, force, light, heat, or pressure.

For example, the external input may include not only a touch from the part of the user's body such as a hand but also an external input (for example, hovering) applied when approaching the electronic apparatuses 1000 and 1001 or brought close thereto within a distance. Also, the electronic apparatuses 1000 and 1001 according to an embodiment may sense an external input from the electromagnetic pen PN that generate a magnetic field. Also, the electronic apparatuses 1000 and 1001 may sense multiple types of inputs different from each other. For example, the electronic apparatuses 1000 and 1001 may sense the external input from the electromagnetic pen PN and the external input from the user's hand.

FIG. 1A illustrates the external input from the electromagnetic pen PN of the user. Although not illustrated, the electromagnetic pen PN may be attached to and detached from the inside or outside of the electronic apparatuses 1000 and 1001, and the electronic apparatuses 1000 and 1001 may provide and receive signal in response to the attachment and detachment of the electromagnetic pen PN.

The display surface FS may include a first active area F-AA (an active area) and a first peripheral area F-NAA (a peripheral area). The first peripheral area F-NAA is adjacent to the first active area F-AA. The first peripheral area F-NAA may have light transmittance lower than that of the first active area F-AA and may have a color.

In the embodiment, the first peripheral area F-NAA may surround the first active area F-AA. Accordingly, the shape of the first active area F-AA may be substantially defined by the first peripheral area F-NAA. However, this is merely illustrated as an example, and the first peripheral area F-NAA may be disposed adjacent to only one side of the first active area F-AA or omitted.

The electronic apparatuses 1000 and 1001 according to the embodiment may be folded about a folding axis. For example, referring to FIG. 1B, a first folding axis AX1, which is virtual and extends in the first direction DR1, may be defined in the electronic apparatus 1000. The first folding axis AX1 may extend in the first direction DR1 on the display surface FS.

The display surface FS of the electronic apparatus 1000 may include a folding area FA which is folded by the first folding axis AX1 and a first non-folding area NFA1 and a second non-folding area NFA2 which are spaced apart from each other in the second direction DR2 with the folding area FA therebetween. The electronic apparatus 1000 may be folded about the first folding axis AX1 in a direction in which the first non-folding area NFA1 and the second non-folding area NFA2 face each other. For example, the electronic apparatus 1000 may be folded in an in-folding method.

Also, as illustrated in FIGS. 1C and 1D, the electronic apparatus 1000 may be folded about a second folding axis AX2 in a direction in which the first non-folding area NFA1 and the second non-folding area NFA2 are opposed to each other. For example, the electronic apparatus 1000 may be folded in an out-folding method. In case that the electronic apparatus 1000 is completely folded, a display surface FS-F in the folded state having an area relatively smaller than that of the display surface FS in the unfolded state may be provided as illustrated in FIG. 1D.

The electronic apparatus 1000 may operate in only one method selected among the in-folding method or the out-folding method about one folding axis. Also, the electronic apparatus 1000 may operate in the in-folding method and the out-folding method about one folding axis.

Also, as illustrated in FIG. 1E, multiple folding axes may be defined in the electronic apparatus 1001. In the electronic apparatus 1001, there may be defined a first folding axis AX1 and a second folding axis AX2 which each extend in the first direction DR1 and are spaced apart from each other in the second direction DR2. The electronic apparatus 1001 may be folded about each of the first and second folding axes AX1 and AX2. A display surface FS1 of the electronic apparatus 1001 may include a first folding area FA1 and a second folding area FA2 which are folded about the first and second folding axes AX1 and AX2, respectively, and first to third non-folding areas NFA1, NFA2, and NFA3 which are spaced apart from each other in the second direction DR2 with the first and second folding areas FA1 and FA2 therebetween.

For example, the electronic apparatus 1001 may be folded about the first folding axis AX1 in the out-folding method. Accordingly, the electronic apparatus 1001 is folded about the first folding axis AX1 such that the first non-folding area NFA1 and the second non-folding area NFA2 are opposed to each other, and the first folding area FA1 protrudes toward the first folding axis AX1.

Also, the electronic apparatus 1001 may be folded about the second folding axis AX2 in the in-folding method. Accordingly, the electronic apparatus 1001 is folded such that the second non-folding area NFA2 and the third non-folding area NFA3 face each other, and the second folding area FA2 surrounds the second folding axis AX2.

Here, the electronic apparatus 1001 may be folded about each of the first and second folding axes AX1 and AX2 in the same manner. Also, an electronic apparatus according to an embodiment may be folded about three or more folding axes, and the extending directions of the folding axes may be defined as directions other than the first direction DR1. However, the embodiments not limited thereto and may sense an external input and be folded in other ways.

Figure 2A:
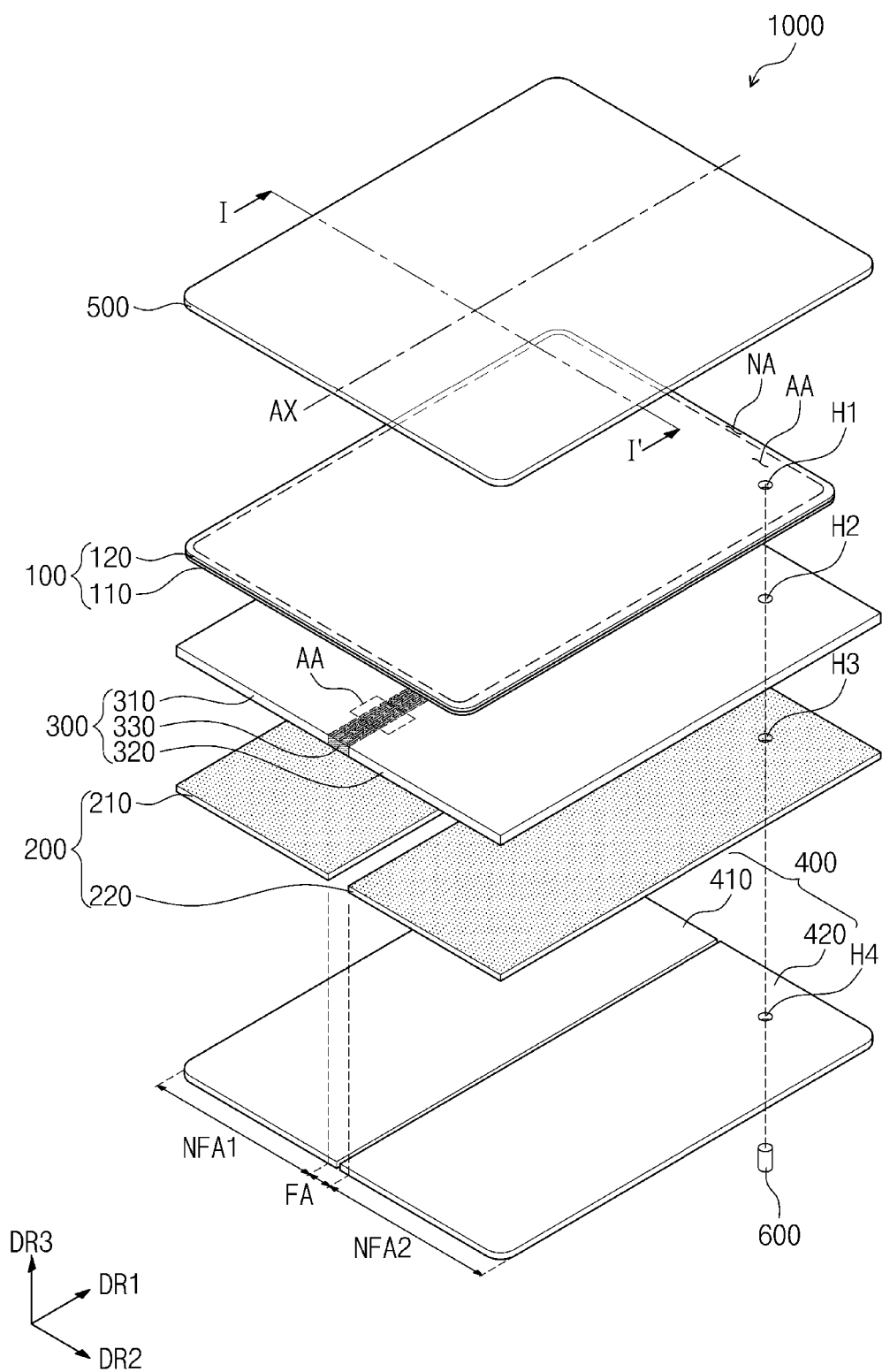
FIG. 2A is an exploded schematic perspective view of an electronic apparatus according to an embodiment.
Figure 2B:
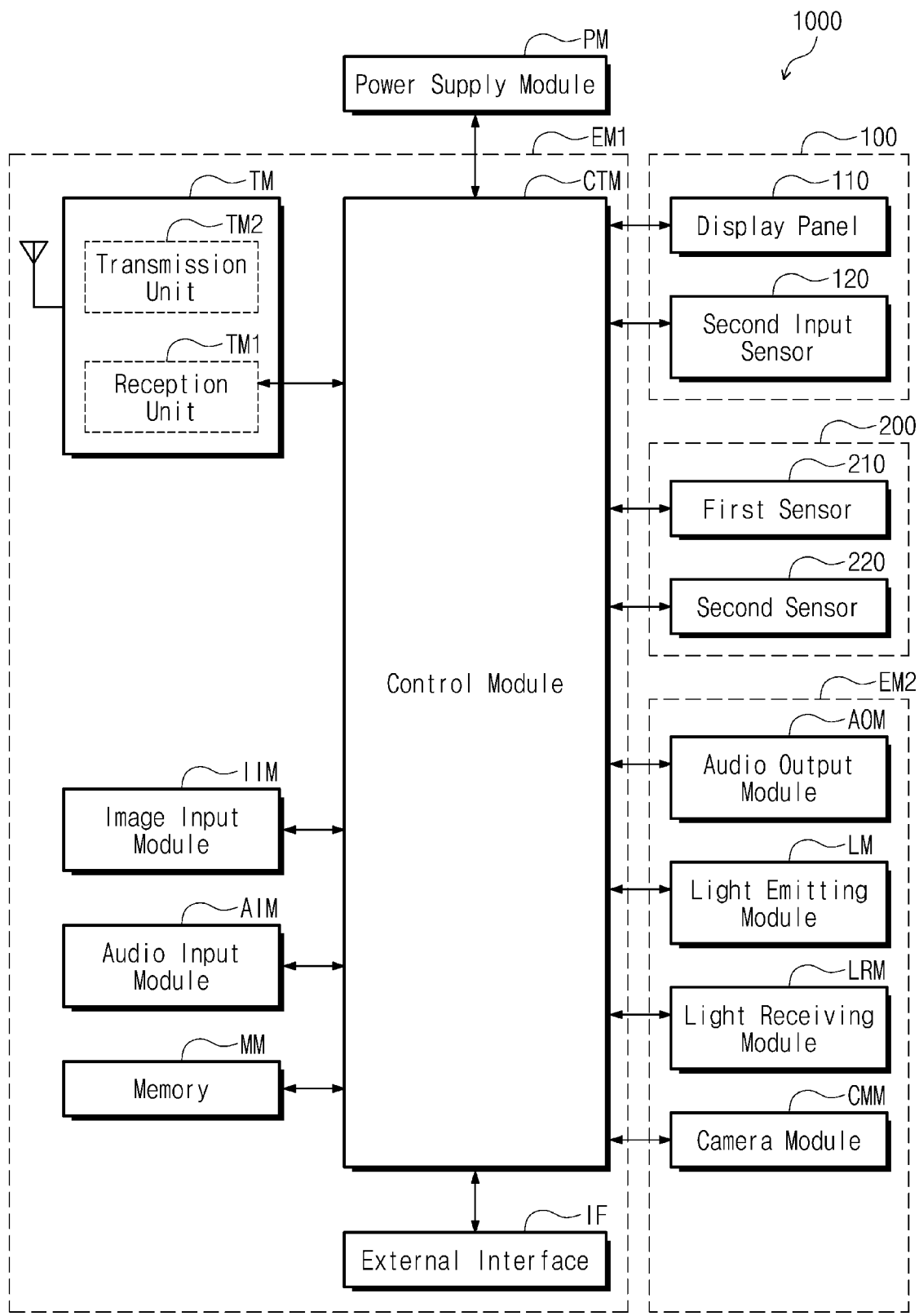
FIG. 2B is a block diagram of an electronic apparatus according to an embodiment.

FIG. 2A is an exploded schematic perspective view of an electronic apparatus according to an embodiment. FIG. 2B is a block diagram of an electronic apparatus according to an embodiment. FIG. 2A schematically illustrates an exploded perspective view of the electronic apparatus 1000 of in FIG. 1A, and FIG. 2B illustrates components illustrated in FIG. 2A, and some components omitted in FIG. 2A in a block diagram. Hereinafter, an embodiment will be described with reference to FIGS. 2A and 2B.

As illustrated in FIG. 2A, the electronic apparatus 1000 may include an electronic panel 100, a first input sensor 200, a first support plate 300, a second support plate 400, and a window 500.

The electronic panel 100 may be flexible panel. Accordingly, the electronic panel 100 may be rolled entirely, or folded or unfolded about a folding axis AX. The electronic panel 100 may include an active area AA and a peripheral area NA.

The active area AA may display an image or sense an applied external input. The peripheral area NA is adjacent to the active area AA. The peripheral area NA is illustrated as surrounding the active area AA in the embodiment, but an embodiment is not limited thereto.

The electronic panel 100 may include a display panel 110 and an input sensor 120 (hereinafter, referred to as a second input sensor). The display panel 110 generates the image. The display panel 110 may be a light emitting-type display panel but is not limited thereto. For example, the display panel 110 may be an organic light emitting display panel or a quantum-dot light emitting display panel. A light emitting layer of the organic light emitting display panel may include an organic light emitting material. A light emitting layer of the quantum-dot light emitting display panel may include quantum dots, quantum rods, or the like. Hereinafter, the display panel 110 is described as the organic light emitting display panel.

The display panel 110 may include light emitting parts. The light emitting parts are disposed in the active area AA and respectively emit light of a color. When multiple light emitting layers are provided, the light emitting parts may respectively correspond to the light emitting layers. Also, when a light emitting layer is provided as a single layer, the light emitting parts may respectively correspond to color filters or color converting members.

The second input sensor 120 is disposed on the display panel 110. The second input sensor 120 may sense an external input. In the embodiment, the second input sensor 120 may sense a signal transmitted from hand of a user. The second input sensor 120 may sense the positions and/or intensities with respect to the hand of the user applied over the entire surface of the active area AA. However, this is merely described as an example, and the second input sensor 120 may sense various types of inputs, and the embodiments are not limited thereto.

The second input sensor 120 may include sensing electrodes. The sensing electrodes may be disposed in the active area AA. The second input sensor 120 may sense information about the position or intensity of the applied external input through a change in capacitance between the sensing electrodes due to the external input or a change in resistance of the sensing electrodes.

The second input sensor 120 may be disposed directly on the display panel 110. According to an embodiment, the second input sensor 120 may be formed on the display panel 110 through a continuous process. The second input sensor 120 may be provided directly on the display panel 110 without a separate adhesive film or coupling member. However, the embodiment is not limited thereto, and the second input sensor 120 may be attached to the display panel 110 with the coupling member such as the adhesive film. The second input sensor 120 is manufactured in a process independent of the display panel 110 and then may be attached to the top surface of the display panel 110 with the adhesive film. However, this is merely described as an example, and the second input sensor 120 may be omitted in the electronic panel 100 according to an embodiment.

The first input sensor 200 is disposed between the electronic panel 100 and the second support plate 400. The first input sensor 200 may sense an external input which is different from the external input sensed by the electronic panel 100 and from the external input sensed by the second input sensor 120. For example, the first input sensor 200 may sense an external input from the electromagnetic pen PN (see FIG. 1A) described above.

The first input sensor 200 may sense the position or intensity of the electromagnetic pen PN which is being input to the window 500. For example, the first input sensor 200 may include a digitizer. The first input sensor 200 may be driven in a manner using electromagnetic resonance (EMR) through electromagnetic induction. However, this is merely described as an example, and the first input sensor 200 may be designed to be driven in various ways to sense the input of the electromagnetic pen PN, and the embodiment is not limited thereto.

The first input sensor 200 may include a first sensor 210 and a second sensor 220. The first sensor 210 overlaps a first non-folding area NFA1, and the second sensor 220 overlaps a second non-folding area NFA2. The first sensor 210 and the second sensor 220 may be spaced apart from each other in the second direction DR2 with a folding area FA therebetween. The first sensor 210 and the second sensor 220 may have the same structure and may be driven in the same manner. According to an embodiment, the first input sensor 200 may not subject to stress due to folding, and thus it is possible to prevent damage due to the folding. In other embodiments, the first input sensor 200 may be provided as a single sensor that overlaps the entire folding area FA, the first non-folding area NFA1, and the second non-folding area NFA2, but the embodiments are not limited thereto.

The first support plate 300 is disposed between the electronic panel 100 and the first input sensor 200 to support the electronic panel 100. The first support plate 300 may include a first support part 310, a second support part 320, and a folding part 330. The first support part 310 and the second support part 320 may be spaced apart from each other in the second direction DR2 with the folding part 330 therebetween.

The first support part 310 and the second support part 320 overlap the first non-folding area NFA1 and the second non-folding area NFA2, respectively. Each of the first support part 310 and the second support part 320 has insulating properties. For example, each of the first support part 310 and the second support part 320 may include plastic or glass.

The folding part 330 overlaps the folding area FA and may be perforated by holes. The holes may allow the shape of the folding part 330 to be easily changed when folded. Here, the folding part 330 may include a material different from those of the first support part 310 and the second support part 320. For example, the folding part 330 may include a single metal or an alloy. Accordingly, the folding part 330 may stably protect the folding area FA of the electronic panel 100 even in the folded state. However, this is merely described as an example, and the folding part 330 may be made of the same material as the first support part 310 and the second support part 320, but the embodiments are not limited thereto.

The second support plate 400 is disposed below the first input sensor 200 to support the first input sensor 200. The second support plate 400 may include a first plate 410 and a second plate 420 spaced apart from each other in the second direction DR2.

The first plate 410 overlaps the first non-folding area NFA1 in a plan view. The second plate 420 overlaps the second non-folding area NFA2 in a plan view. For ease of description, the folding area FA, the first non-folding area NFA1, and the second non-folding area NFA2 are illustrated in the second support plate 400.

The second support plate 400 may have higher modulus than the first support plate 300. The first and second plates 410 and 420 may include materials having higher modulus than the first and second support parts 310 and 320. For example, each of the first and second plates 410 and 420 may include metal such as a copper alloy or stainless steel (SUS). Accordingly, the second support plate 400 may protect the first input sensor 100 from an external impact.

The window 500 is disposed on the electronic panel 100. The window 500 overlaps the active area AA of the electronic panel 100 and provides an optically transparent area. The window 500 may provide the front surface FS of the electronic apparatus 1000. The external input such as the electromagnetic pen PN may be substantially applied to the window 500. The image displayed on the electronic panel 100 may be viewed by the user through the window 500.

The window 500 may include thin film glass or synthetic resin film. When the window 500 includes the thin film glass, the thickness of the window 500 may be about 100 μm or less and, for example, about 30 μm, but the thickness of the window 500 may be is not limited thereto. When the window 500 includes the synthetic resin film, the window 500 may include a polyimide (PI) film or a polyethylene terephthalate (PET) film.

The window 500 may have a multi-layer structure or a single-layer structure. For example, the window 500 may include a plurality of synthetic resin films coupled by an adhesive, or a glass substrate and a synthetic resin film which are coupled to each other by an adhesive. The window 500 may be made of a flexible material. Accordingly, the window 500 may be folded or unfolded about the folding axis AX. When the shape of the electronic panel 100 changes, the shape of the window 500 may also change according to the shape of the electronic panel 100.

The window 500 may protect against external impacts as well as allows an image from the electronic panel 100 to be displayed. Thus, the window 500 may prevent the electronic panel 100 from being damaged or malfunctioning due to an external impact. The external impact may be a force from the outside expressed as a pressure, a stress, or the like, and may cause defects in the electronic panel 100.

Here, although not illustrated, the electronic apparatus 1000 may further include a protective layer disposed on the window 500. The protective layer may be a layer for improving impact resistance of the window 500 and preventing scattering when the window 500 is broken. The protective layer may include at least one of urethane-based resin, an epoxy-based resin, a polyester-based resin, a polyether-based resin, an acrylate-based resin, an acrylonitrile-butadiene-styrene (ABS) resin, and rubber. For example, the protective layer may include at least one of phenylene, polyethyleneterephthalate (PET), polyimide (PI), polyamide (PAI), polyethylene naphthalate (PEN), and polycarbonate (PC).

The electronic apparatus 1000 may further include one or more functional layers disposed between the electronic panel 100 and the window 500, although such layers are not illustrated. For example, the functional layer may be an anti-reflection layer for preventing reflection of external light. The anti-reflection layer may prevent elements constituting the electronic panel 100 from being visible from the outside due to the external light that is incident through the front surface of the electronic apparatus 1000. The anti-reflection layer may include a retarder, a polarizer, or a color filter.

An electronic module 600 may be disposed below the second support plate 400. The electronic module 600 may include at least one of a camera, a speaker, a light detection sensor, and a heat detection sensor. The electronic module 600 may include a plurality of components, but the embodiments are not limited thereto.

The electronic module 600 may be disposed overlapping the active area AA. Accordingly, through-holes H1, H2, H3, and H4 may be defined in the electronic panel 100, the first input sensor 200, the first support plate 300, and the second support plate 400, respectively. An object outside the electronic apparatus 1000 may be sensed through the through-holes H1, H2, H3, and H4, or a sound signal such as voice may be provided to the outside. Here, this is merely illustrated as an example. In other embodiments, one of the through-holes H1, H2, H3, and H4 may be omitted. In other embodiments, the electronic module 600 may not be disposed to overlap the active area AA, and the through-holes H1, H2, H3, and H4 may be omitted.

Referring to FIG. 2B, an electronic apparatus 1000 may further include a power supply module PM, a first electronic module EM1, and a second electronic module EM2. An electronic panel 100, a first input sensor 200, the power supply module PM, the first electronic module EM1, and the second electronic module EM2 may be electrically connected to each other.

The power supply module PM supplies power required for the overall operation of the electronic apparatus 1000. The power supply module PM may include a general battery module.

The first electronic module EM1 and the second electronic module EM2 may include various functional modules for operating the electronic apparatus 1000. The first electronic module EM1 may be directly mounted on a mother board electrically connected to the electronic panel 100 or may be mounted on a separate substrate and electrically connected to a mother board through a connector or the like (not shown).

The first electronic module EM1 may include a control module CTM, a wireless communication module TM, an image input module IIM, an audio input module AIM, a memory MM, and an external interface IF. Without being mounted on a mother board, some of the modules may be electrically connected to the mother board through a flexible circuit board.

The control module CTM controls overall operations of the electronic apparatus 1000. The control module CTM may be a microprocessor. For example, the control module CTM activates or deactivates the electronic panel 100. The control module CTM may control other modules such as the image input module IIM or the audio input module AIM based on a touch signal received from the electronic panel 100.

The wireless communication module TM may receive and transmit a wireless signal from and to another terminal by using Bluetooth or Wi-Fi connection. The wireless communication module TM may receive and transmit a voice signal by using a general communication line. The wireless communication module TM includes a transmission unit TM1 for modulating a signal to be transmitted and transmitting the signal and a reception unit TM2 for demodulating the received signal.

The external interface IF serves as an interface connecting an external charger, wired/wireless data ports, a card socket (for example, a memory card, a SIM/UIM card), or the like.

The second module EM2 may include an audio output module AOM, a light emitting module LM, a light receiving module LRM, a camera module CMM, and the like. The components may be directly mounted on a mother board, may be mounted on a separate substrate, and electrically connected to the electronic panel 100 through a connector or the like (not shown), or may be electrically connected to the first electronic module EM1.

The audio output module AOM converts audio data received from the wireless communication module TM or audio data stored in the memory MM and then outputs the converted audio data to the outside.

The light emitting module LM generates and outputs light. The light emitting module LM may output infrared light. For example, the light emitting module LM may include an LED element. The light receiving module LRM may sense infrared light. The light receiving module LRM may be activated when an infrared light having a threshold value or higher is sensed. The light receiving module LRM may include a CMOS sensor. The infrared light generated in the light emitting module LM is output and then reflected from an external object (for example, the finger or face of a user). The reflected infrared light may be incident onto the light receiving module LRM. The camera module CMM captures an external image.

The electronic module 600 according to an embodiment may include at least one of the components of the second electronic module EM2. For example, the electronic module 600 may include at least one of a camera, a speaker, a light detection sensor, and a heat detection sensor. The electronic module 600 may sense an external object received through the through-holes H1, H2, H3, and H4 and provide a sound signal such as voice to the outside through the through-holes H1, H2, H3, and H4. Also, the electronic module 600 may include multiple elements, but the embodiments are not limited thereto.

Figure 3:
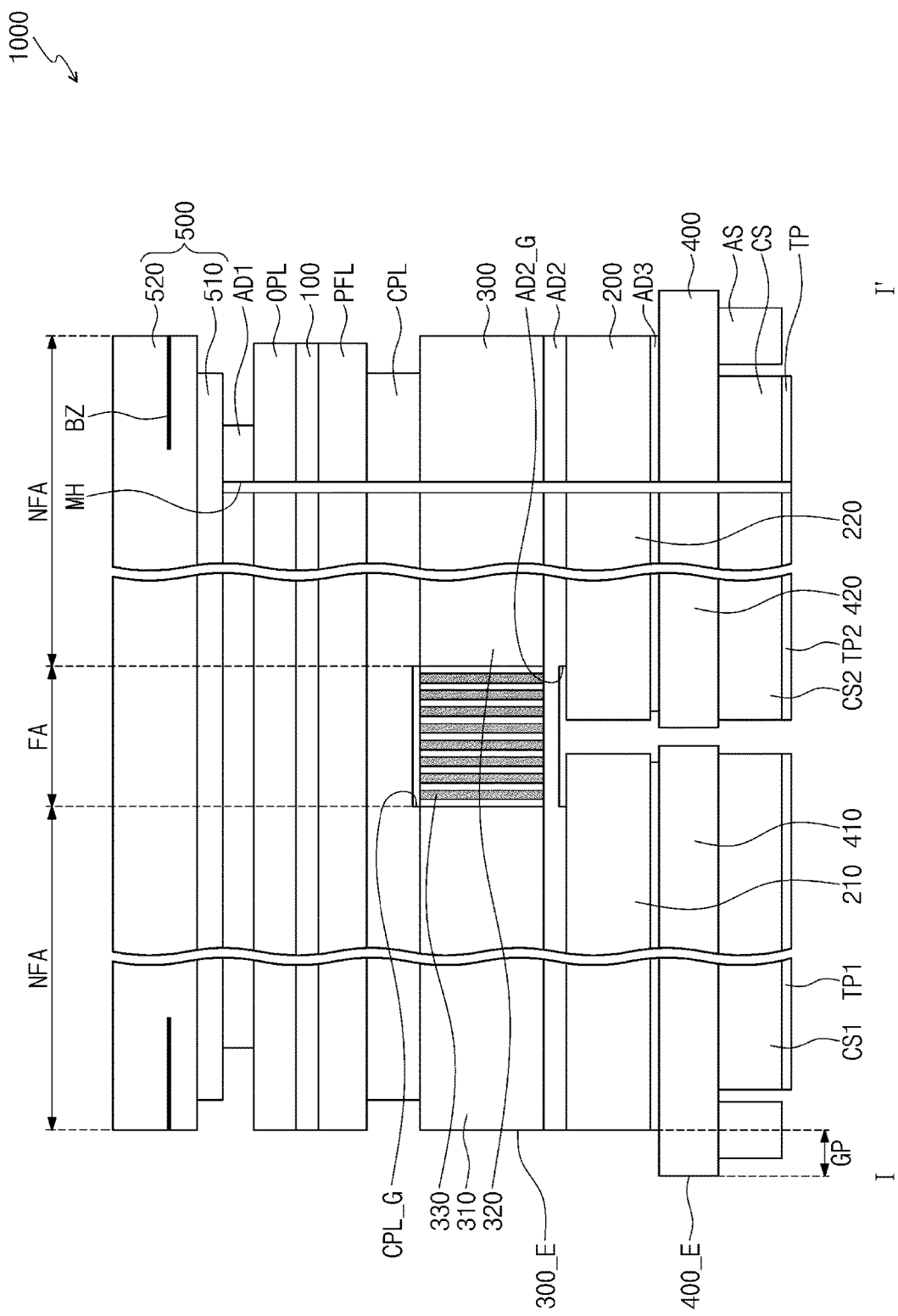
FIG. 3 is a schematic cross-sectional view of an electronic apparatus according to an embodiment.
Figure 4A:
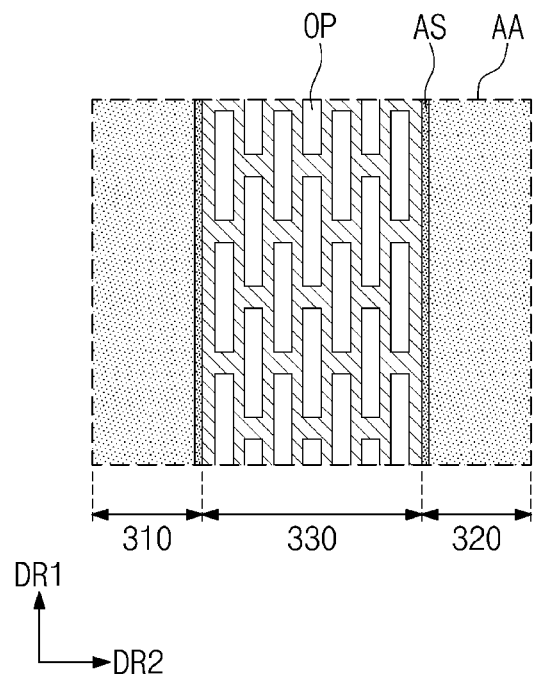
FIGS. 4A and 4B are schematic plan views of a portion of an electronic apparatus according to an embodiment.
Figure 4B:
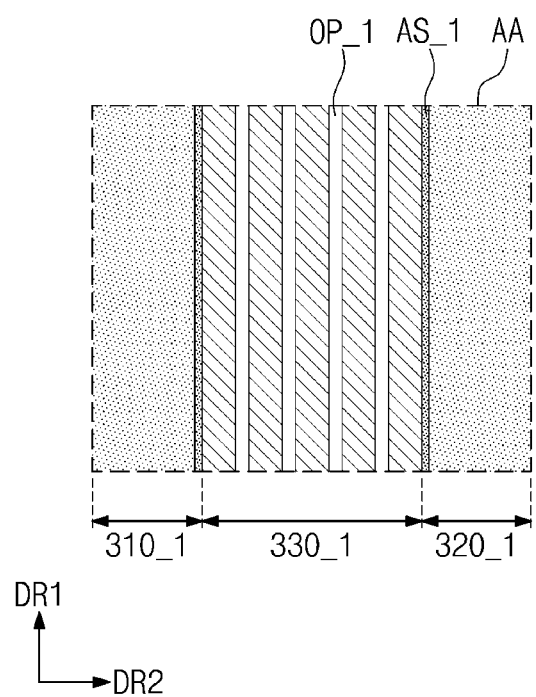

FIG. 3 is a schematic cross-sectional view of an electronic apparatus according to an embodiment. FIGS. 4A and 4B are schematic plan views of a portion of an electronic apparatus according to an embodiment. FIG. 3 illustrates a cross-section taken along line I-I′ of FIG. 2A, and FIGS. 4A and 4B schematically illustrate a region AA illustrated in FIG. 2A. Hereinafter, an embodiment will be described with reference to FIGS. 3 to 4B. Here, the same reference numerals may be given to the same components as those illustrated in FIGS. 1A to 2B, and previously described components will not be repeated.

As illustrated in FIG. 3, an electronic apparatus 1000 may further include various functional layers in addition to an electronic panel 100, a first input sensor 200, a first support plate 300, a second support plate 400, and a window 500.

The window 500 may include a first layer 510, a second layer 520, and a bezel pattern BZ. The first layer 510 may include glass. For example, the first layer 510 may have a thickness of about 10 μm or less. Accordingly, the first layer 510 may be easily folded.

The second layer 520 may be disposed on the first layer 510. The second layer 520 may include a material having relatively lower modulus than the first layer 510. For example, the second layer 520 may be a film including an organic material. The second layer 520 may have a relatively greater thickness than the first layer 510. The second layer 520 may protect the top surface of the first layer 510.

Here, the bezel pattern BZ may be inserted into the second layer 520. However, this is merely illustrated as an example, and the bezel pattern BZ may be disposed on the bottom surface of top surface of the second layer 520. The bezel pattern BZ may be a color pattern or a reflective pattern. The bezel pattern BZ may define the first peripheral area F-NAA described above. However, this is merely illustrated as an example, and the bezel pattern BZ may be omitted in the window 500 according to an embodiment. Also, the window 500 may be formed in a single layer or may include other functional layers, but the embodiments are not limited thereto.

The electronic apparatus 1000 may include an optical layer OPL and an adhesive layer AD1. The optical layer OPL and the adhesive layer AD1 may be provided between the window 500 and the electronic panel 100. The optical layer OPL may be disposed on the electronic panel 100. The optical layer OPL may reduce reflectivity of external light. The optical layer OPL may include an elongated synthetic resin film. For example, the optical layer OPL may be provided by dying a polyvinyl alcohol film (PVA film) with an iodine compound. Also, the optical layer OPL may include a color filter. The optical layer OPL may include various layers that may reduce the reflectivity of external light, but the embodiments are not limited thereto.

The optical layer OPL may be attached to the window 500 by the adhesive layer AD1. The adhesive layer AD1 may include an optical clear adhesive (OCA) an optical clear resin (OCR), or a pressure sensitive adhesive (PSA). The first adhesive layer AD1 and adhesive layers described below may include the same material or include a general adhesive or bonding agent.

The electronic apparatus 1000 may include a panel protective film PFL and a lower protective film CPL. The panel protective film PFL and the lower protective film CPL may be provided between the electronic panel 100 and the first support plate 300.

The panel protective film PFL may be disposed below the electronic panel 100. The panel protective film PFL may protect a lower portion of the electronic panel 100. The panel protective film PFL may include a flexible plastic material. For example, the panel protective film PFL may include polyethylene terephthalate.

The lower protective film CPL may be disposed below the panel protective film PFL. The lower protective film CPL may have a color. The lower protective film CPL may protect the rear surface of the electronic panel 100 and prevent the rear surface of the electronic panel 100 from being seen due to light. The lower protective film CPL may be made of a material having a high light absorption rate.

A recessed portion CPL_G overlapping a folding area FA may be provided in the lower protective film CPL. The recessed portion CPL_G may reduce the thickness of the lower protective film CPL within the folding area FA and thus reduce folding stress. Also, as an adhesive layer is further provided in the recessed portion CPL_G, the coupling force with the first support plate 300 may be enhanced.

The first support plate 300 and the first input sensor 200 may be attached to each other with an adhesive layer AD2. A recessed portion AD2_G overlapping the folding area FA may be provided in the adhesive layer AD2. The folding stress in the folding area FA may be reduced by the recessed portion AD2_G. In other embodiments, the recessed portion AD2_G may be omitted in the adhesive layer AD2 and a portion of the adhesive layer AD2 overlapping the folding area FA may be removed, but the embodiments are not limited thereto.

The first support part 310, the second support part 320, and the folding part 330 of the first support plate 300 will be examined in detail with reference to FIGS. 4A and 4B. As illustrated in FIG. 4A, the folding part 330 may be disposed between the first support part 310 and the second support part 320.

In the embodiment, the folding part 330 may be made of a material different from those of the first support part 310 and the second support part 320. For example, the first support part 310 and the second support part 320 may be made of an insulating material such as plastic or glass, and the folding part 330 may be made of metal or an alloy. The folding part 330 may be attached to each of the first support part 310 and the second support part 320 through an adhesive layer AS.

Holes OP may be provided in the folding part 330. Accordingly, the folding part 330 may have a lattice shape in a plan view. As the sizes of the holes OP change, the shape of the first support plate 300 within the folding area FA may easily change. Also, although not illustrated, the holes OP may be filled with a material having high flexibility.

As illustrated in FIG. 4B, opening portions OP_1 having a slit shape may be defined in a folding part 330_1. Accordingly, the folding part 330_1 may have the form of stripes spaced apart from each other in the second direction DR2. The ends of the folding part 330_1 are respectively attached to first and second support parts 310_1 and 320_1 through an adhesive layer AS_1.

The second support plate 400 and the first input sensor 200 may be attached to each other through an adhesive layer AD3. A first plate 410 and a second plate 420 may be attached to a first sensor 210 and a second sensor 220, respectively.

The electronic apparatus 1000 may further include a cushion layer CS, an insulating layer TP, and a level difference-compensating member AS, which are disposed below the second support plate 400. The cushion layer CS may absorb an external impact to protect the electronic panel 100. The cushion layer CS may include a foam sheet or a sponge having an elastic force. The cushion layer CS may include polyurethane. The cushion layer CS may be provided in multiple layers CS1 and CS2 and may be attached to the first plate 410 and the second plate 420, respectively.

The insulating layer TP may be disposed below the cushion layer CS. The insulating layer TP may include an insulating film. The insulating layer TP may prevent electrostatic discharge from entering. The insulating layer TP may be provided in multiple layers TP1 and TP2 and may be attached to the first plate 410 and the second plate 420, respectively. The level difference-compensating member AS may be attached to a lower side of the second support plate 400. The level difference-compensating member AS may be a double-sided tape or an insulating film.

In the electronic apparatus 1000 according to an embodiment, an edge 400_E (hereinafter, a second edge) of the second support plate 200 may protrude further outward than does an edge 300_E (hereinafter, a first edge) of the first support plate 300. In the embodiment, a distance GP between the first edge 300_E and the second edge 400_E may be from about 100 μm (micrometers) to about 500 μm. When the distance GP between the first edge 300_E and the second edge 400_E is less than about 100 μm, interference with the first support plate 300 is highly likely to occur due to the thickness of the second support plate 400. Accordingly, it may be difficult for the second support plate 400 to protect the first support plate 300.

If the distance GP between the first edge 300_E and the second edge 400_E exceeds about 500 μm, a dead space of the electronic apparatus 1000 may be increased, and thus a bezel may be enlarged. Thus, in the embodiment, the distance GP between the first edge 300_E and the second edge 400_E may be from about 100 μm to about 500 μm. Herein, the term "dead space" may be understood as a space which is devoted to accommodating one or more components that, either singularly or plurally, perform an intended function.

According to an embodiment, the second edge 400_E may protrude further outward that does the first edge 300_E, and thus the external impact applied to the electronic apparatus 1000 may be applied to the second support plate 400 before the first support plate 300. Accordingly, damage to the first support plate 300, which has a relatively lower strength, may be prevented, and the second support plate 400, which has a relatively higher strength, may protect other components including the first support plate 300. Thus, the reliability of the electronic apparatus 1000 may be enhanced.

Figure 5A:
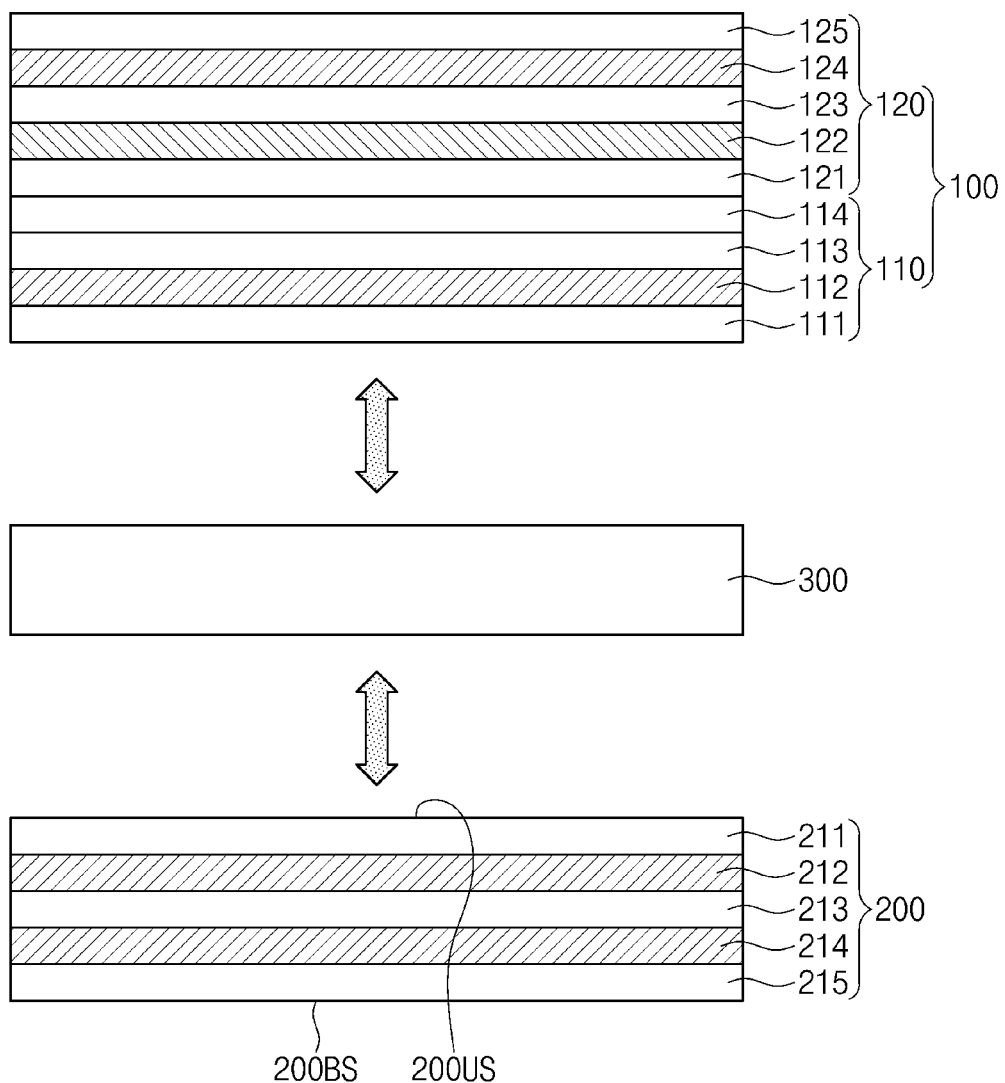
FIG. 5A is a schematic cross-sectional view illustrating some components of an electronic apparatus according to an embodiment.
Figure 5B:
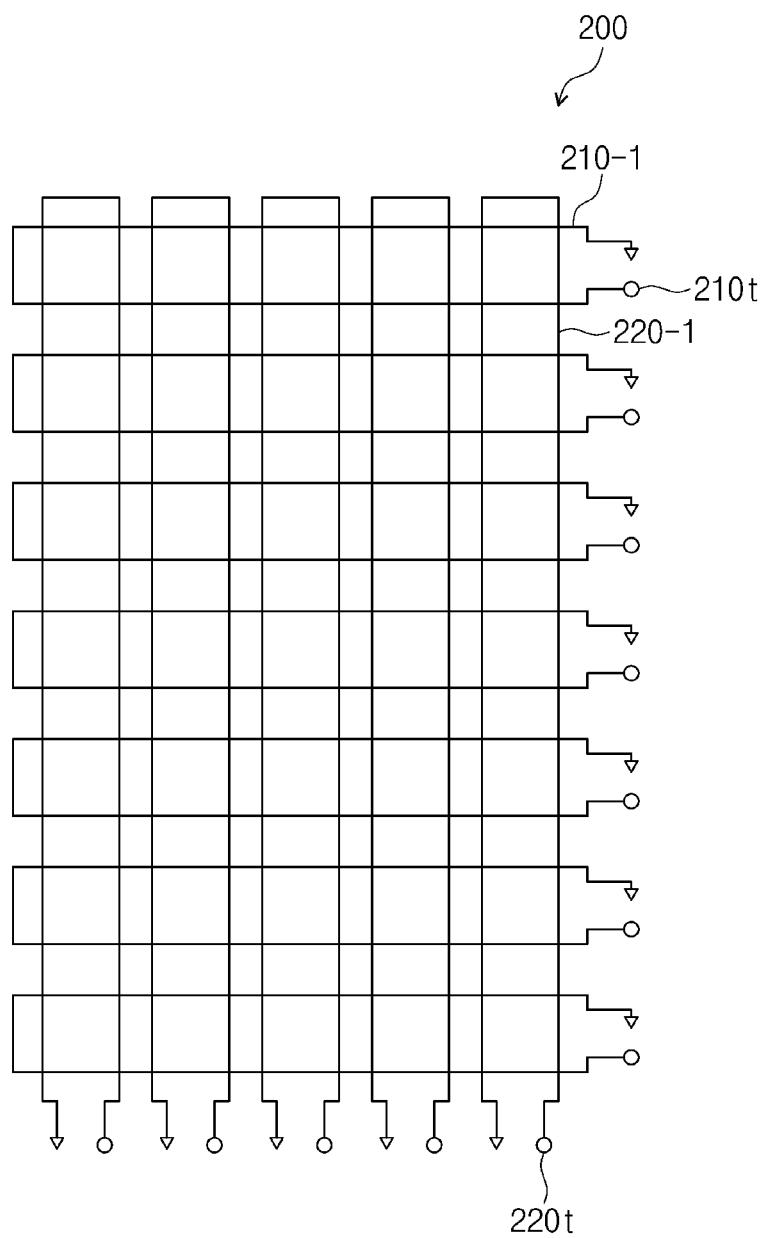
FIG. 5B is a schematic view illustrating some components of an electronic apparatus according to an embodiment.

FIG. 5A is a schematic cross-sectional view illustrating some components of an electronic apparatus according to an embodiment. FIG. 5B is a schematic view illustrating some components of an electronic apparatus according to an embodiment. FIG. 5A illustrates a stack relationship between an electronic panel 100, a first input sensor 200, and a first support plate 300 among components of an electronic apparatus 1000, and FIG. 5B schematically illustrates a signal diagram of the first input sensor 200. Hereinafter, an embodiment will be described with reference to FIGS. 5A and 5B.

As illustrated in FIG. 5A, a display panel 110 may include a base layer 111, a circuit layer 112, a light emitting element layer 113, and an encapsulation layer 114.

The base layer 111 may include a synthetic resin film. The synthetic resin layer may include thermosetting resin. The base layer 111 may have a multi-layer structure. For example, the base layer 111 may have a three-layer structure of a synthetic resin layer, an adhesive layer, and a synthetic resin layer. The synthetic resin layer may be a polyimide-based resin layer, but the material is not limited thereto. The synthetic resin layer may include at least one of an acryl-based resin, a methacryl-based resin, a polyisoprene-based resin, a vinyl-based resin, an epoxy-based resin, a urethane-based resin, a cellulose-based resin, a siloxane-based resin, a polyamide-based resin, and a perylene-based resin. The base layer 111 may include a glass substrate or an organic/inorganic composite material substrate, or the like.

The circuit layer 112 may be disposed on the base layer 111. The circuit layer 112 may include an insulating layer, a semiconductor pattern, a conductive pattern, a signal line, and the like. The insulating layer, the semiconductor layer, and the conductive layer are formed on the base layer 111 through coating and deposition methods, and subsequently, the insulating layer, the semiconductor layer, and the conductive layer may be selectively patterned through photolithography processes performed multiple times. Subsequently, the semiconductor pattern, the conductive pattern, and the signal line included in the circuit layer 112 may be formed.

The light emitting element layer 113 may be disposed on the circuit layer 112. The light emitting element layer 113 may include a light emitting element. For example, the light emitting element layer 113 may include an organic light emitting material, a quantum dot, a quantum rod, or micro-LED.

The encapsulation layer 114 may be disposed on the light emitting element layer 113. The encapsulation layer 114 may include an inorganic layer, an organic layer, and an inorganic layer which are stacked in this order, but layers constituting the encapsulation layer 114 are not limited thereto.

The inorganic layers may protect the light emitting element layer 113 from moisture and oxygen, and the organic layer may protect the light emitting element layer 113 from impurities such as dust particles. The inorganic layers may include a silicon nitride layer, a silicon oxynitride layer, a silicon oxide layer, a titanium oxide layer, an aluminum oxide layer, or the like. The organic layer may include an acrylic-based organic layer, but the embodiment is not limited thereto.

In an embodiment, the second input sensor 120 is disposed directly on the display panel 110. The second input sensor 120 may include a base insulating layer 121, a first conductive layer 122, a sensing insulating layer 123, a second conductive layer 124, and a cover insulating layer 125.

The base insulating layer 121 may be disposed directly on the display panel 110. For example, the base insulating layer 121 may directly contact the encapsulation layer 114. The base insulating layer 121 may have a single- or multi-layer structure. In other embodiments, the base insulating layer 121 may be omitted. The base insulating layer 121 may also be provided on a separate base layer, and the base layer may be attached to the display panel 110 through an adhesive member.

Each of the first conductive layer 122 and the second conductive layer 124 may have a single-layer structure or a multi-layer structure in which layers are stacked in the third direction axis DR3. The conductive layer having the single-layer structure may include a metal layer or a transparent conductive layer. The metal layer may include molybdenum, silver, titanium, copper, aluminum, or an alloy thereof. The transparent conductive layer may include transparent conductive oxides such as an indium tin oxide (ITO), an indium zinc oxide (IZO), a zinc oxide (ZnO), or an indium zinc tin oxide (IZTO). The transparent conductive layer may include a conductive polymer such as PEDOT, metal nanowire, graphene, and the like.

The conductive layer having the multi-layer structure may include multi metal layers. The multi metal layers may have, for example, a three-layer structure of titanium/aluminum/titanium. The conductive layer having the multi-layer structure may include at least one metal layer and at least one transparent conductive layer.

Each of the first conductive layer 122 and the second conductive layer 124 may include patterns that constitute sensing electrodes. The second input sensor 120 may acquire information about an external input through a change in capacitance between the sensing electrodes.

The sensing insulating layer 123 is disposed between the first conductive layer 122 and the second conductive layer 124 and may cover the first conductive layer 122. A portion of the second conductive layer 124 may be electrically connected to a portion of the first conductive layer 122 through a contact hole that passes through the sensing insulating layer 123. The cover insulating layer 125 is disposed on the sensing insulating layer 123 and may cover the second conductive layer 124.

At least one of the base insulating layer 121, the sensing insulating layer 123, and the cover insulating layer 125 may include an inorganic film. The inorganic film may include at least one of aluminum oxide, titanium oxide, silicon oxide, silicon oxynitride, zirconium oxide, and hafnium oxide.

At least one of the base insulating layer 121, the sensing insulating layer 123, and the cover insulating layer 125 may include an organic film. The organic film may include at least one of an acryl-based resin, a methacryl-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

The first input sensor 200 includes first and second sensors 210 and 220. Each of the first and second sensors 210 and 220 may sense an external input by using electromagnetic resonance (EMR) through electromagnetic induction.

According to an electromagnetic resonance (EMR) method, a magnetic field may be generated in a resonant circuit provided inside the electromagnetic pen PN, which may induce signals in coils included in each of the first and second sensors 210 and 220 by the oscillating magnetic field, and the positions of the electromagnetic pen PN may be sensed through the signals induced in the coils. In an embodiment, a layer structure of the first input sensor 200 may correspond to a structure of each of the first sensor 210 and the second sensor 220.

The first input sensor 200 may include a base film 211, a first conductive layer 212, a first insulating layer 213, a second conductive layer 214, and a second insulating layer 215. The base film 211, the first conductive layer 212, the first insulating layer 213, the second conductive layer 214, and the second insulating layer 215 may be stacked sequentially in a direction away from the electronic panel 100.

The base film 211 may include a plastic film and may include, for example, at least one of polyethyleneterephthalate (PET), polyimide (PI), polyamide (PAI), polyethylene naphthalate (PEN), and polycarbonate (PC). The base film 211 may define a top surface 200US of the first input sensor 200.

The first conductive layer 212 may be disposed on the bottom surface of the base film 211. The first conductive layer 212 includes a conductive material. For example, the first conductive layer 212 may include copper, but the embodiment is not limited thereto.

The first conductive layer 212 may include conductive patterns. The conductive patterns may constitute coils for the electromagnetic resonance. For example, some conductive patterns may constitute first coils 210-1 of FIG. 5B, and the other conductive patterns may constitute second coils 220-1 of FIG. 5B. Also, all the conductive patterns may be included in the first coils 210-1, or all the conductive patterns may be included in the second coils 220-1.

The first insulating layer 213 is disposes between the first conductive layer 212 and the second conductive layer 214. The first insulating layer 213 may include epoxy, but the embodiment is not limited thereto. The first insulating layer 213 covers the first conductive layer 212 and may insulate the first conductive layer 212 from the outside.

The second conductive layer 214 may be disposed on the bottom surface of the first insulating layer 213. The second conductive layer 214 may include conductive patterns. For example, some conductive patterns may constitute first coils 210-1 of FIG. 5B, and the other conductive patterns may constitute second coils 220-1 of FIG. 5B. All the conductive patterns may be included in the first coils 210-1, or all the conductive patterns may be included in the second coils 220-1.

The second insulating layer 215 covers a lower side of the second conductive layer 214 to protect the second conductive layer 214. The second insulating layer 215 may define a bottom surface 200BS of the first input sensor 200.

Referring to FIG. 5B, the first input sensor 200 may include a first coils 210-1 and second coils 220-1. The first coils 210-1 may be referred to as driving coils, and the second coils 220-1 may be referred to as sensing coils.

The first coils 210-1 may be respectively insulated from and cross the second coils 220-1. To sense the electromagnetic pen PN of FIG. 1A, alternating current signals are sequentially provided to first terminals 210$t$ of the first coils 210-1. The first coils 210-1 are formed in a closed curve shape. Thus, when an electric current flows through the first coils 210-1, lines of magnetic force may be induced between the first coils 210-1 and the second coils 220-1. In the second coils 220-1, signals, which sense the induced electromagnetic force discharged from the electromagnetic pen PN, may be output to second terminals 220t of the second coils 220-1.

FIG. 5B illustrates a configuration of a digitizer, but the embodiment is not limited thereto. Also, the arrangement relationship between the first coils 210-1 and the second coils 220-1 is not limited to that illustrated in FIG. 5B and may be modified.

Referring to FIG. 5A again, the first support plate 300 may be disposed between the electronic panel 100 and the first input sensor 200. As described above, the conductive layers 212 and 214 for sensing an external input from the electromagnetic pen PN are disposed in the first input sensor 200, and the external input from the electromagnetic pen PN is applied to an upper side of the electronic panel 100 to the window 500 (see FIG. 2A).

The first support plate 300 according to an embodiment may have electrically insulating properties. The folding part 330, which may include a conductive material, is disposed only in the folding area FA, and thus the area of the folding part 330 overlapping the first input sensor 200 may be small. Accordingly, the first input sensor 200 may stably sense the external input without being electrically affected by the first support plate 300.

Figure 6A:
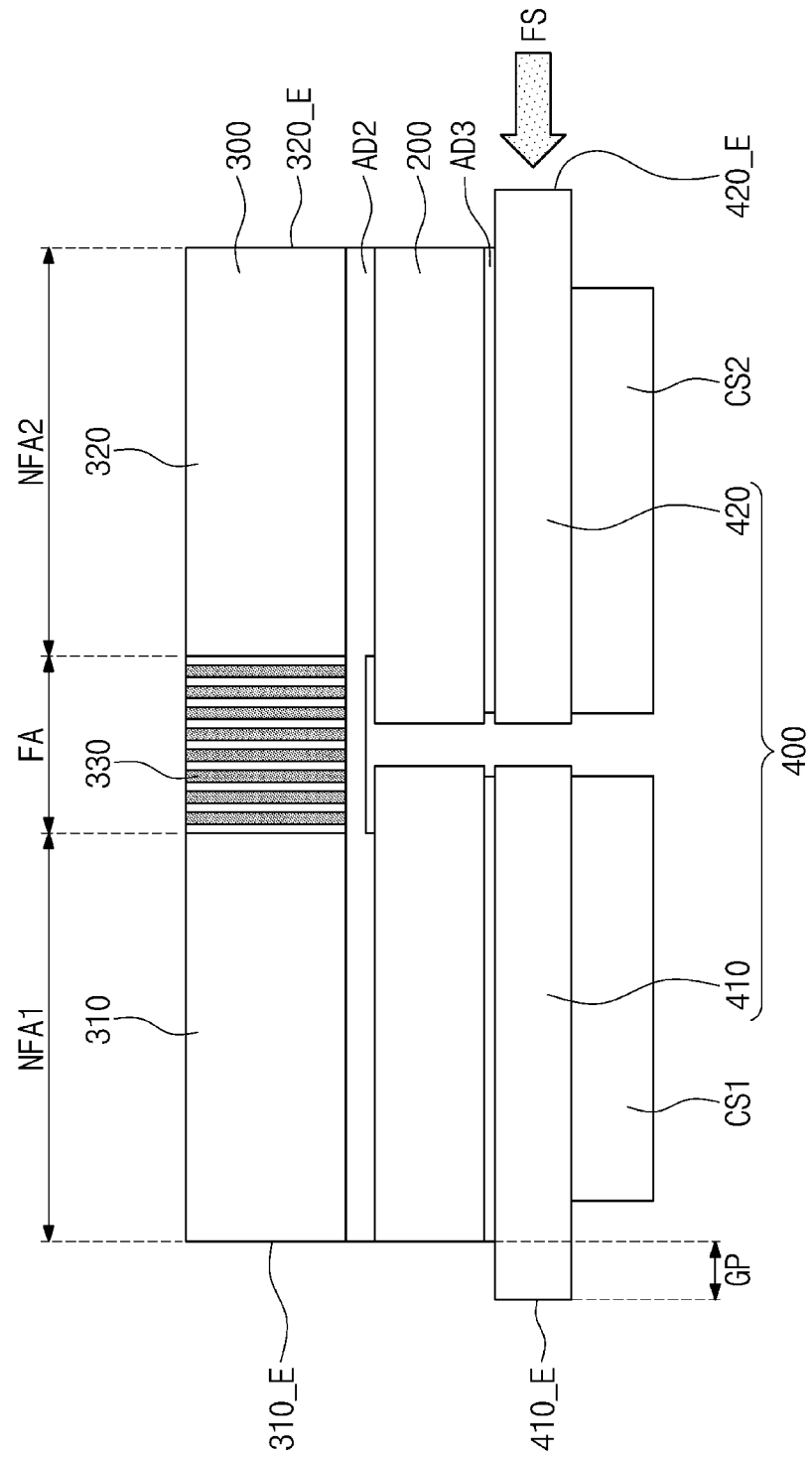
Figure 6B:
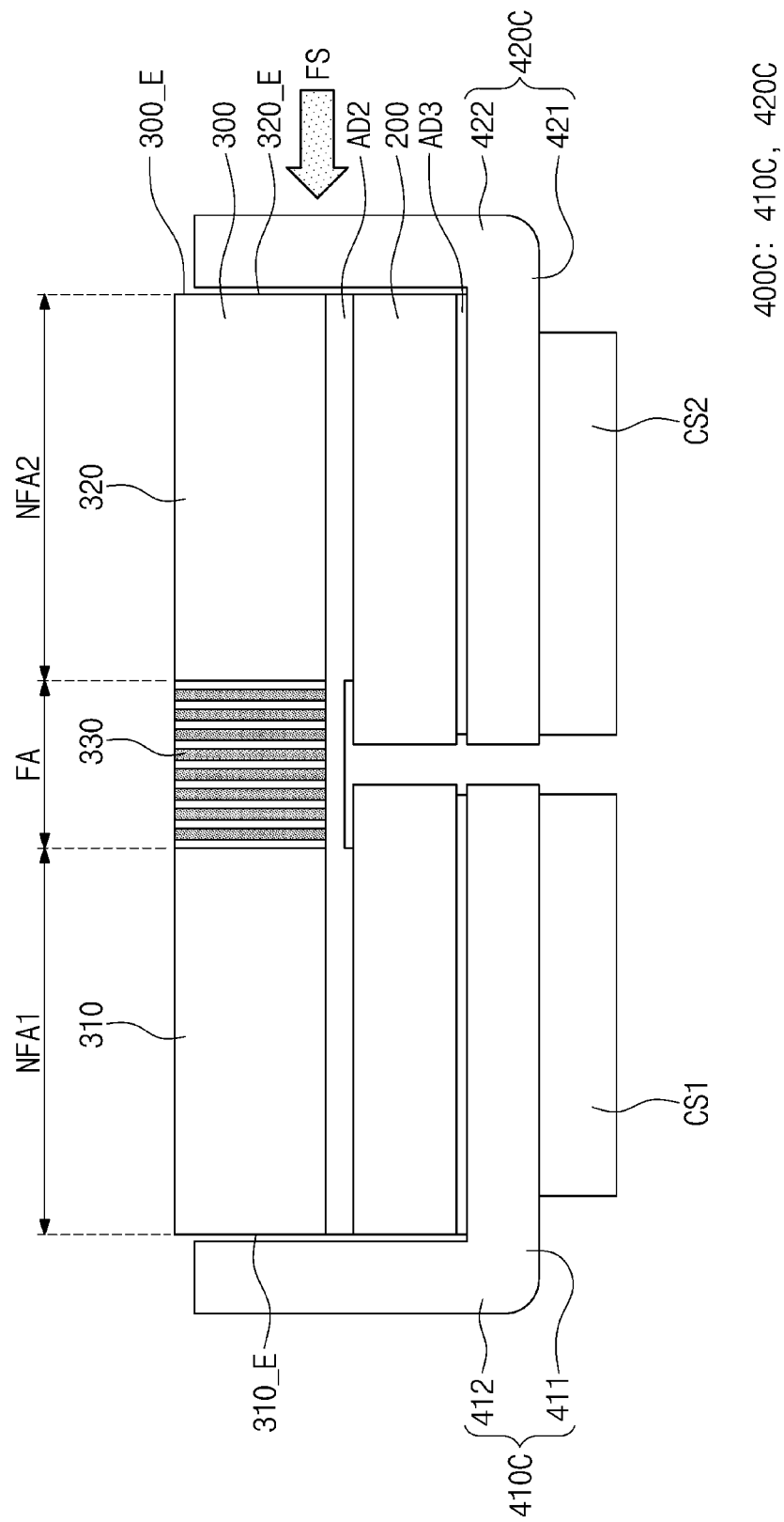

FIGS. 6A to 6C are schematic cross-sectional views of electronic apparatuses according to embodiments. In FIGS. 6A to 6C, only components disposed below the electronic panel 100 are illustrated. Hereinafter, an embodiment will be described with reference to FIGS. 6A and 6C. Here, the same reference numerals may be given to the same components as those illustrated in FIGS. 1A to 5B, and their descriptions will not be repeated.

In an electronic apparatus illustrated in FIG. 6A, an edge of a second support plate 400 may protrude further outward than does an edge of a first support plate 300. An edge 410_E of a first plate 410 may protrude by a predetermined gap GP from an edge 310_E of a first support part 310 to the outside. Similarly, an edge 420_E of a second plate 420 may protrude further outward than does an edge 320_E of a second support part 320.

Accordingly, when an external impact FS is applied to the electronic apparatus 1000, the external impact FS may be applied to the second support plate 400 which protrudes most outward as illustrated in FIG. 6A. The second support plate 400 may include metal or the like and has high strength, and thus may be able to withstand the external impact FS.

As described above, the first support plate 300 may be made of glass or plastic to improve the sensitivity of a first input sensor 200. Thus, the first support plate 300 may have relatively lower strength than the second support plate 400. According to an embodiment, the external impact FS is absorbed in the second support plate 400, and thus the external impact FS may be prevented from affecting the first support plate 300. Therefore, the reliability of the electronic apparatus 1000 may be enhanced.

Also, as illustrated in FIG. 6B, a second support plate 400C may further include at least one bending portion. A first plate 410C may include a first flat portion 411 and a first bending portion 412. The first flat portion 411 overlaps a first non-folding area NFA1, and the first bending portion 412 bends and extends upward from the first flat portion 411. The first bending portion 412 extends to a first input sensor 200 and an edge 310_E of a first support part 310 and may protect the first support part 310. Similarly, a second plate 420C may include a second flat portion 421 and a second bending portion 422. The second bending portion 422 extends to an edge 320_E of a second support part 320 and may protect the second support part 320.

An external impact FS may be applied to either the first bending portion 412 or the second bending portion 422. Accordingly, it is possible to prevent the external impact FS from being applied directly to a first support plate 300, and thus it is possible to prevent the first support plate 300 from being damaged and to improve the reliability of the electronic apparatus.

Also, as illustrated in FIG. 6C, a second support plate 400C1 may further include a plurality of bending portions. A first plate 410C1 may include a first flat portion 411, a first bending portion 412, and a first additional bending portion 413. The first flat portion 411 overlaps a first non-folding area NFA1, and the first bending portion 412 bends and extends upward from the first flat portion 411. The first additional bending portion 413 bends and extends downward from the first bending portion 412.

In a direction in which a first support part 310 is viewed, the first bending portion 412 and the first additional bending portion 413 overlap an edge 310_E of the first support part 310. Accordingly, the edge 310_E of the first support part 310 may be protected by the first additional bending portion 413 and the first bending portion 412. Thus, it is possible to prevent an external impact FS from being applied directly to a first support plate 300.

Similarly, a second plate 420C1 may include a second flat portion 421, a second bending portion 422, and a second additional bending portion 423. In a direction in which a second support part 320 is viewed, the second bending portion 422 and the second additional bending portion 423 overlap an edge 320_E of the second support part 320. The edge 320_E of the second support part 320 may be protected from an external impact FS by the second bending portion 422 and the second additional bending portion 423.

According to an embodiment, the edge 400_E of the second support plate 400 protrudes outward than does the edge 300_E of the first support plate 300, and thus damage to the first support plate 300 may be prevented. Accordingly, the reliability of the electronic apparatus may be enhanced.

According to the embodiments, the reliability of the electronic apparatus against the external impact may be improved.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:
1. An electronic apparatus comprising:
   an electronic panel comprising:
      light emitting parts; and
      an active area in which the light emitting parts are arranged, the active area comprising:

a folding area that is foldable with respect to a folding axis extending in a first direction; and a first non-folding area and a second non-folding area that are adjacent to the folding area and spaced apart from each other in a second direction intersecting the first direction;

a first support plate disposed below the electronic panel, the first support plate comprising:

a folding part overlapping the folding area of the active area; and a first support part and a second support part spaced apart from each other in the second direction, the folding part being disposed between the first support part and the second support part;

a second support plate disposed below the first support plate, the second support plate comprising:

a first plate and a second plate spaced apart from each other in the second direction, the folding axis disposed between the first plate and the second plate in a plan view; and a first input sensor disposed between the first support plate and the second support plate, the first input sensor sensing a first external input, wherein an edge of the second support plate located in each of the first plate and the second plate protrudes further in the second direction than an edge of the first support plate protrudes.

2. The electronic apparatus of claim 1, wherein a gap between the edge of the second support plate and the edge of the first support plate is in a range of about 100 micrometers to about 500 micrometers.

3. The electronic apparatus of claim 1, wherein each of the first support part and the second support part each comprises glass or plastic.

4. The electronic apparatus of claim 3, wherein the folding part comprises metal.

5. The electronic apparatus of claim 3, wherein the folding part includes a plurality of through-portions which pass through the folding part in a plan view.

6. The electronic apparatus of claim 5, wherein the folding part has a lattice shape in a plan view.

7. The electronic apparatus of claim 5, wherein the folding part has a shape of stripes arranged in the second direction in a plan view.

8. The electronic apparatus of claim 1, wherein the electronic panel further comprises a second input sensor which overlaps the active area and senses a second external input, and the second external input is different from the first external input.

9. The electronic apparatus of claim 8, wherein the first external input includes a pen input, and the second external input includes a touch input by a user.

10. The electronic apparatus of claim 1, wherein the first plate and the second plate have side surfaces facing each other, the folding area of the active area is disposed between the first plate and the second plate.

11. The electronic apparatus of claim 1, wherein each of the first plate and the second plate of the second support plate comprises:

a flat portion that overlaps the electronic panel; and a bending portion that extends and bends from the flat portion and does not overlap the electronic panel in a plan view, and the bending portion overlaps the edge of the first support plate in a view of the second direction.

12. The electronic apparatus of claim 11, wherein each of the first plate and the second plate of the second support plate further comprises an additional bending portion that extends and bends from the bending portion, and the bending portion and the additional bending portion overlap the edge of the first support plate in a view of the second direction.

13. The electronic apparatus of claim 1, wherein the second support plate comprises a copper alloy or stainless steel.

14. An electronic apparatus comprising:

an electronic panel comprising:

a folding area that is foldable with respect to a folding axis extending in a first direction; and a first non-folding area and a second non-folding area that are adjacent to the folding area and spaced apart from each other in a second direction intersecting the first direction;

a first support plate disposed below the electronic panel, the first support plate comprising:

a folding part overlapping the folding area; and a first support part and a second support part spaced apart from each other in the second direction, the folding part being disposed between the first support part and the second support part;

a second support plate disposed below the first support plate, the second support plate comprising:

a first plate and a second plate space apart from each other in the second direction; and an input sensor disposed between the first support plate and the second support plate, the input sensor sensing an external input, wherein each of the first plate and the second plate of the second support plate includes an edge further protruding than an edge of the first support plate in a plan view.

15. The electronic apparatus of claim 14, wherein the first support part and the second support part are electrically insulated.

16. The electronic apparatus of claim 14, wherein a gap between the edge of the second support plate and the edge of the first support plate is in a range of about 100 micrometers to about 500 micrometers.

17. The electronic apparatus of claim 14, wherein each of the first plate and the second plate of the second support plate comprises:

a flat portion that overlaps the first support part; and a bending portion that extends and bends from the flat portion, and the bending portion overlaps the edge of the first support plate in a view of the second direction.

18. The electronic apparatus of claim 17, wherein each of the first late and the second plate of the second support plate further comprises an additional bending portion that extends and bends from the bending portion, and the bending portion and the additional bending portion overlap the edge of the first support plate in a view of the second direction.

19. The electronic apparatus of claim 14, wherein the second support plate comprises a copper alloy or stainless steel.

20. The electronic apparatus of claim 14, wherein the folding part comprises a material different from a material of the first support part and a material of the second support part.

* * * * *